United States Patent
Liu et al.

(10) Patent No.: US 11,073,878 B2
(45) Date of Patent: Jul. 27, 2021

(54) THERMAL COOLING SYSTEM

(71) Applicant: INTEL CORPORATION, Santa Clara, CA (US)

(72) Inventors: Baomin Liu, Austin, TX (US); Eduardo Escamilla, Round Rock, TX (US); James Utz, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 115 days.

(21) Appl. No.: 15/957,874

(22) Filed: Apr. 19, 2018

(65) Prior Publication Data
US 2019/0050031 A1    Feb. 14, 2019

(51) Int. Cl.
*G06F 1/20* (2006.01)
*H05K 7/20* (2006.01)

(52) U.S. Cl.
CPC ......... *G06F 1/203* (2013.01); *H05K 7/20154* (2013.01); *H05K 7/20327* (2013.01); *G06F 1/20* (2013.01); *G06F 1/206* (2013.01)

(58) Field of Classification Search
CPC ............ G06F 1/20; G06F 1/203; G06F 1/206; H05K 7/20154
USPC ..................................... 165/104.33
See application file for complete search history.

(56) References Cited

U.S. PATENT DOCUMENTS

| | | | |
|---|---|---|---|
| 7,589,962 B1* | 9/2009 | Bhatia ................ | F28D 15/0233 165/104.19 |
| 2006/0196643 A1* | 9/2006 | Hata ...................... | G06F 1/203 165/104.33 |
| 2007/0284093 A1* | 12/2007 | Bhatti ..................... | G06F 1/206 165/104.33 |
| 2008/0019093 A1* | 1/2008 | Hongo .................... | G06F 1/203 361/693 |
| 2013/0327507 A1* | 12/2013 | Degner ............. | H05K 7/20145 165/120 |
| 2017/0094835 A1* | 3/2017 | Prather ................ | H01L 23/427 |

* cited by examiner

*Primary Examiner* — Joel M Attey
(74) *Attorney, Agent, or Firm* — Patent Capital Group

(57) ABSTRACT

Particular embodiments described herein provide for a device that can include at least one heat source and a vapor chamber, where the vapor chamber is bigger than the at least one heat source and a portion of the vapor chamber is in direct contact with the at least one heat source, where the portion of the vapor chamber in direct contact with the at least one heat source does not include a stiffener. In an example, the device can include a first air mover on a first side of the at least one heat source and a second air mover on an opposite side of the at least one heat source. Exhaust from the first air mover can pass through a vented foot and exhaust from the second air mover can pass through a second vented foot.

13 Claims, 11 Drawing Sheets

THERMAL COOLING SYSTEM

TECHNICAL FIELD

This disclosure relates in general to the field of computing and/or device cooling, and more particularly, to a thermal cooling system.

BACKGROUND

Emerging trends in systems place increasing performance demands on the system. The increasing demands can cause thermal increases in the system. The thermal increases can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

The figures of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a thermal cooling system. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

Figure 1:
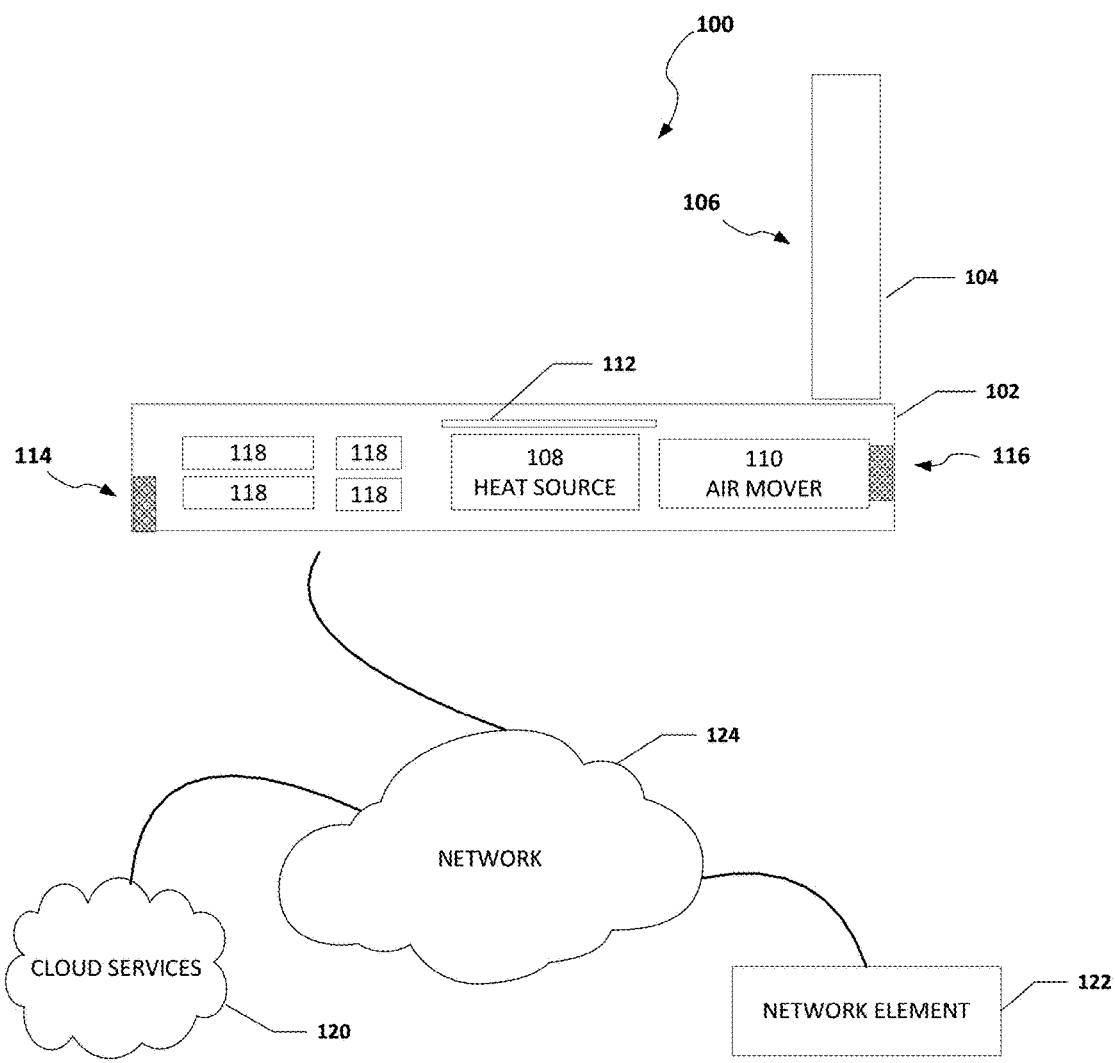
FIG. 1 is a simplified block diagram of a system to enable a thermal cooling system, in accordance with an embodiment of the present disclosure.

FIG. 1 is a simplified block diagram of an electronic device configured to enable a thermal cooling system, in accordance with an embodiment of the present disclosure. In an example, electronic device 100 can include a first housing 102 and a second housing 104. First housing 102 can include at least one heat source 108, at least one air mover 110, a vapor chamber 112, at least one intake air vent 114, at least one exhaust vent 116, and one or more electronics 118. Second housing 104 can include a display 106. Electronic device 100 may be in communication with cloud services 120 and/or network element 122 using network 124.

Heat source 108 may be one or more heat generating devices (e.g., one or more of any combination of a processor, logic unit, field programmable gate array (FPGA), chip set, a graphics processor, graphics card, battery, memory, or some other type of heat generating device). Air mover 110 can be configured as an air cooling system to help reduce the temperature of heat source 108. In an example, air mover 110 can be a fan.

Electronic device 100 can be configured to allow for a reduced noise thermal cooling system to support sustained power level one (PL1) at fifteen watts (15 W) in a thin clamshell chassis where the base (e.g., first housing 102) is about seven and a half (7.5) millimeters (mm) thick. The design of electronic device 100 can include a balanced, dual fan layout, with relatively efficient airflow paths and vents, and a relatively thin vapor chamber that covers a heat source such as a motherboard area. The heat source can be thermally connected to the vapor chamber, which can be located just below a keyboard baseplate. The vapor chamber can collect heat from the heat source and conduct the heat to fin stacks. Fans can drive an airflow through the fin stacks and the air in the airflow can absorb at least some of the heat and exit the system.

Electronic device 100 can include a thermal management engine that can be configured to control the velocity or speed of air mover 110. Also, electronic device 100 can include a sensor hub engine that can be configured to collect data or thermal parameters related to heat source 108 and other components, elements, devices (e.g., electronics 118) in first housing 102 and communicate the data to the thermal management engine. The term "thermal parameters" includes a measurement, range, indicator, etc. of an element or condition that affects the thermal response, thermal state, and/or thermal transient characteristics of the heat source associated with the thermal parameters. The thermal parameters can include a platform workload intensity, a CPU workload or processing speed, a data workload of a neighboring device, fan speed, air temperature (e.g., ambient air temperature, temperature of the air inside the platform, etc.), power dissipation of the device, or other indicators that may affect the thermal condition of the device. Each of electronics 118 can be a device or group of devices available to assist in the operation or function of first housing 102.

It is to be understood that other embodiments may be utilized and structural changes may be made without departing from the scope of the present disclosure. Substantial flexibility is provided by electronic device 100 in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment.

Elements of FIG. 1 may be coupled to one another through one or more interfaces employing any suitable connections (wired or wireless), which provide viable pathways for network (e.g., network 124, etc.) communications. Additionally, any one or more of these elements of FIG. 1 may be combined or removed from the architecture based on particular configuration needs. Network 124 may include a configuration capable of transmission control protocol/Internet protocol (TCP/IP) communications for the transmission or reception of packets in a network. Electronic device 100 may also operate in conjunction with a user datagram protocol/IP (UDP/IP) or any other suitable protocol where appropriate and based on particular needs.

For purposes of illustrating certain example techniques of electronic device 100, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. However, the increase in performance and/or function causes an increase in the thermal challenges of the devices and systems.

Some conventional thin notebook personal computer (PC) designs orient the motherboard such that components face the D-Cover. When coupled with traditional heat pipe cooling solutions, this creates a hot spot on the D-Cover and is the usual point defining the limit of the system's thermal performance. In these designs, key caps tend to be well-below their spec limit of fourty-four (44) degrees Celsius (C). The current conventional thin PC designs do not balance the skin temperatures or take full advantage of the headroom allowed by the key cap specs and as a result, they do not reach a 15 W U Series thermal design power (TDP) goal in the thinnest form-factor. To meet the TDP goal, some current conventional thin PC designs simply increase the air gap to D-Cover or use faster/louder spinning fans for more airflow, thus driving up the base thicknesses to 8.5-9.5 mm and acoustic noise to around 40 dBA. In addition, many of the components on the motherboard get "left behind" by the heat pipe-based thermal spreaders and those leftover components require additional air cooling to manage them. This air cooling then drives air gaps into the system, adding to the overall thickness of the base.

A device to help mitigate the thermal challenges of a system, as outlined in FIG. 1, can resolve these issues (and others). In an example, an electronic device (e.g., electronic device 100) can include a motherboard orientation that is configured to balance the skin temperatures of the first housing (e.g., base) within its limits, an airflow path of inlet vents and exhaust vents that can reduce losses and increase efficiency, a direct inlet vent design, which has been proven to reduce acoustic noise in testing efforts, and a vapor chamber that collects heat from one or more heat generating components or heat sources. In an example, system components can be arranged with the motherboard located between two fans. The fans can be positioned just inward to permit both I/O space along the sides of the first housing and to direct their exhaust to the hinge area of the first housing.

Using the vapor chamber, heat can be collected from a plurality of heat sources. A fin array can be soldered to the vapor chamber and as the fans drive air through the fin array, the heat from the heat source that was collected by the vapor chamber can be exhausted from the first housing. In an illustrative example, the heat being collected and exhausted can be thirty-five (35) percent (%) more than traditional designs as a result of sinking major component to the vapor chamber. In addition, fewer air gaps are required in the design, resulting in a thinner base stack and first housing.

A conventional thin vapor chamber design includes a pedestal for mounting and stiffness. Not having a pedestal requires mounting holes through the vapor chamber near the SOC position that reduces the thermal spreading efficiency. Thus, a pedestal is usually soldered to the vapor chamber surface and adds thickness to the vapor chamber. An example is the 0.3 mm pedestal that is standard for a 0.6 mm thick vapor chamber. This results in a 0.3 impact to the overall system height. With the thickness of the thermal interface material layer, SOC package and the PCB assumed as 0.1 mm, 1.2 mm, and 0.7 mm, the total stack up in the SOC position reaches 2.9 mm. Electronic device 100 can be configured with a vapor chamber that removes the pedestal from the SOC stack, but maintains stiffening and mounting features. In addition, the SOC touches off directly on the vapor chamber. This removes the thickness and thermal conduction impact disadvantage due to the pedestal of the current solutions. It also allows for the SOC to contact the vapor chamber directly and saves both system thickness and allows for better heat dissipation. The target clamping force for ICL-U SOC is 7 lbf. In an example, vapor chamber 112 can withstand 15 lbf without the soldered pedestal in the SOC area.

In addition, some conventional foot designs generate a gap between a surface that is supporting electronic device 100 and the D-cover for ambient air intake. The problem with the conventional design is that it limits the intake airflow from bottom (front) and top (back), and only allows the ambient air intakes from the left and right sides. It also reduces the flexibility to add local vents to manage hot components and hot spots on the D-Cover. The major disadvantages of the current foot solution are less airflow through the system and limited intake vent locations which can cause the system performance to be unnecessarily capped. Electronic device 100 can be configured with a foot design that is less obstructive to intake vents. In an example, one or more feet can wrap around the exhaust vents (U-shape). The vented feet can allow flexibility to add vents wherever needed.

Turning to the infrastructure of FIG. 1, network 124 represents a series of points or nodes of interconnected communication paths for receiving and transmitting packets of information. Network 124 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 124, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks. The data may help determine a status of a network element or network. Additionally, messages, requests, responses, and queries are forms of network traffic, and therefore, may comprise packets, frames, signals, data, etc.

In an example implementation, electronic device 100, is meant to encompass a computer, a personal digital assistant (PDA), a laptop or electronic notebook, a cellular telephone, an iPhone, an IP phone, network elements, network appliances, servers, routers, switches, gateways, bridges, load balancers, processors, modules, or any other device, component, element, or object that includes a heat source. In an example, the first side is opposite the second side. Electronic device 100 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Electronic device 100 may include virtual elements.

In regards to the internal structure, electronic device 100 can include memory elements for storing information to be used in the operations outlined herein. Electronic device 100 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for the operations described herein. This includes the memory elements being able to store software, logic, code, or processor instructions that are executed to carry out the activities described herein.

In an example implementation, electronic device 100 may include software modules (e.g., thermal management engine, sensor hub engine, etc.) to achieve, or to foster, operations as outlined herein. These modules may be suitably combined in any appropriate manner, which may be based on particular configuration and/or provisioning needs. In example embodiments, such operations may be carried out by hardware, implemented externally to these elements, or included in some other network device to achieve the intended functionality. Furthermore, the modules can be implemented as software, hardware, firmware, or any suitable combination thereof. These elements may also include software (or reciprocating software) that can coordinate with other network elements in order to achieve the operations, as outlined herein.

Additionally, electronic device 100 may include a processor that can execute software or an algorithm to perform activities. A processor can execute any type of instructions associated with the data to achieve operations. In one example, the processors could transform an element or an article (e.g., data) from one state or thing to another state or thing. In another example, activities may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2:
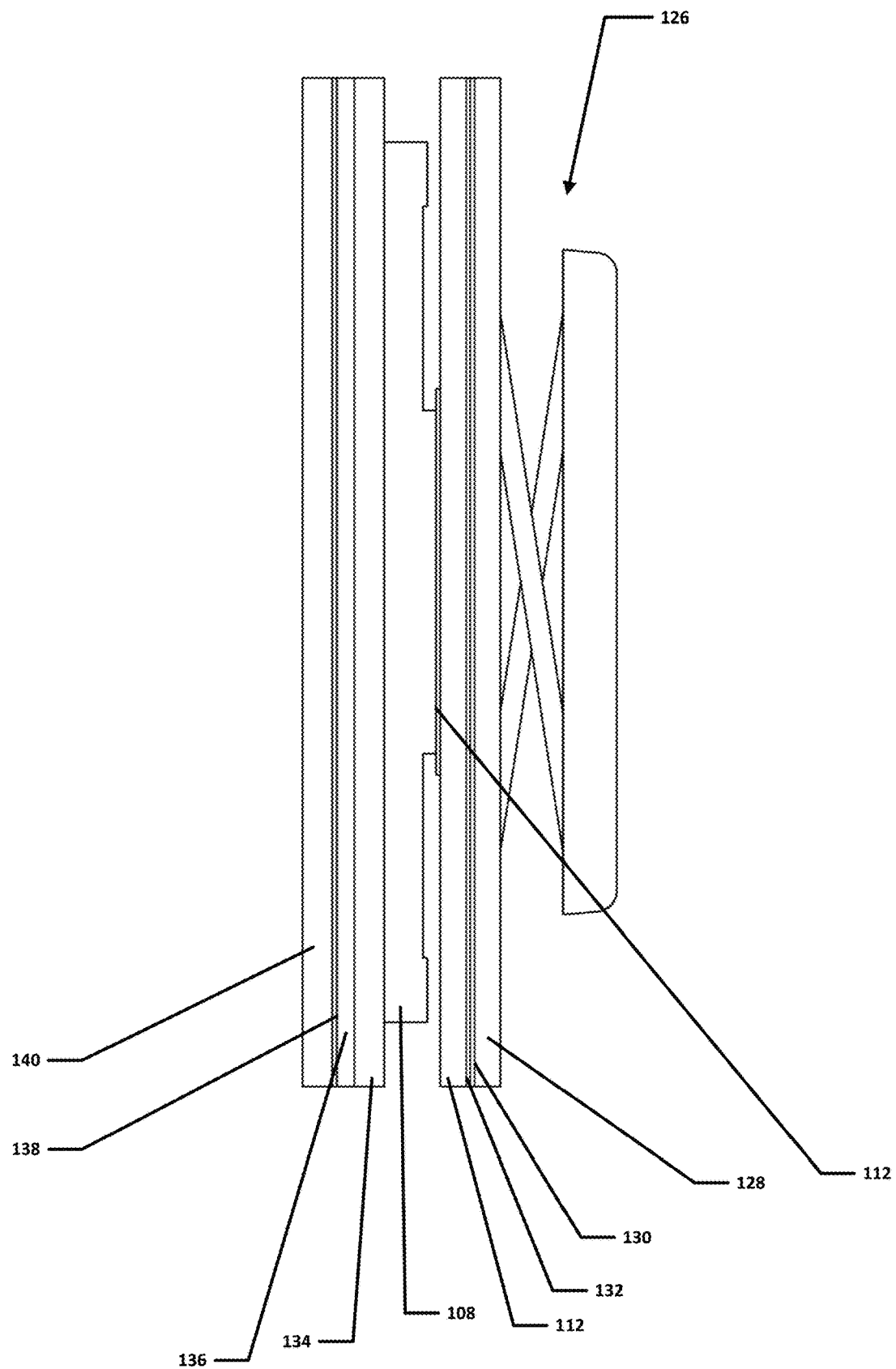
FIG. 2 is a simplified block diagram of a portion of a system to enable a thermal cooling system, in accordance with an embodiment of the present disclosure.

Turning to FIG. 2, FIG. 2 is a simplified block diagram of a portion of first housing 102. In an example, first housing 102 can include a keycap 126, a baseplate 128, a first graphite layer 130, a thermal insulator layer 132, vapor chamber 112, heat source 108, printed circuit board (PCB) 134, a thermal insulator layer 136, a second graphite 138, and a D-cover 140. Vapor chamber 112 can be in direct contact with heat source 108.

Figure 3:
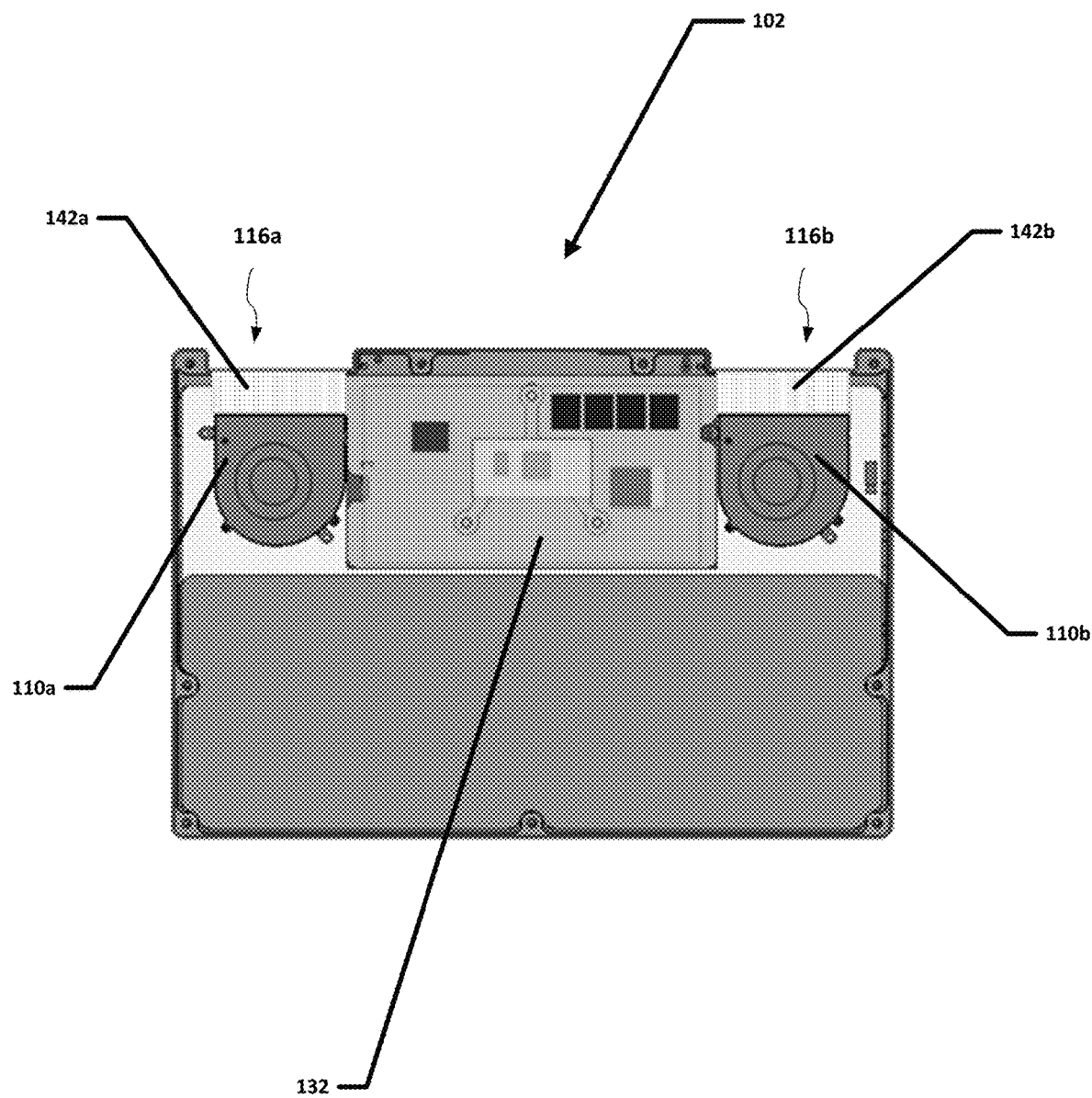
FIG. 3 is a simplified block diagram of a portion of a system to enable a thermal cooling system, in accordance with an embodiment of the present disclosure.

Turning to FIG. 3, FIG. 3 is a simplified block diagram of a portion of first housing 102 configured to include a thermal cooling system. In an example, two air movers can be located on opposite sides of PCB 134. For example, a first air mover 110a may be on a first side of PCB 134 and a second air mover 110b may be on the opposite side of PCB 134. Each air mover 110a and 110b can be coupled to an exhaust vent. For example, air mover 110a can be coupled to exhaust vent 116a using a fin array 142a and air mover 110b can be coupled to exhaust vent 116b using a fin array 142b. By locating two air movers on opposite side of PCB and couple each of the two air movers to an exhaust vent, a relatively efficient airflow can be realized. In an example, each fin array 142a and 142b can be coupled (e.g., soldered) to vapor chamber 112 (not shown)

Figure 4:
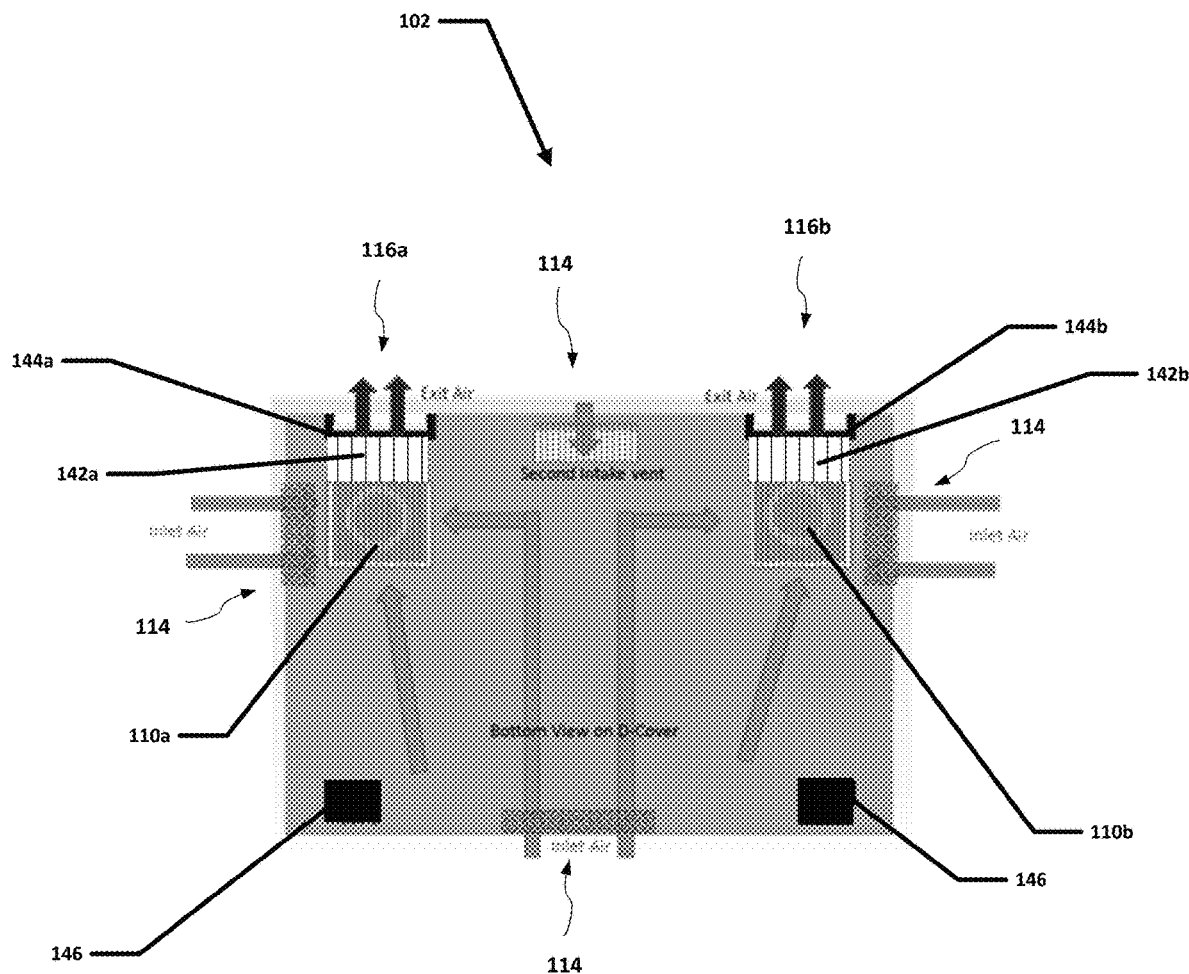
FIG. 4 is a simplified block diagram of a portion of a system to enable a thermal cooling system, in accordance with an embodiment of the present disclosure.

Turning to FIG. 4, FIG. 4 is a simplified block diagram of a portion of first housing 102 configured to include a thermal cooling system. First housing 102 can include vented feet 144a and 144b and feet 146. Vented feet 144a and 144b and feet 144 can help support first housing 102 on a surface and allow air to pass under first housing 102. intake air vent 114 allows air to be drawn into first housing 102 from intake air vents 114 and flow to air mover 110a and 110b. The air from air mover 110a is exhausted through fin array 142a and out of exhaust vent 116a located in vented foot 144a and air from air mover 110b is exhausted through fin array 142b and out of exhaust vent 116b located in vented foot 144b.

Figure 5:
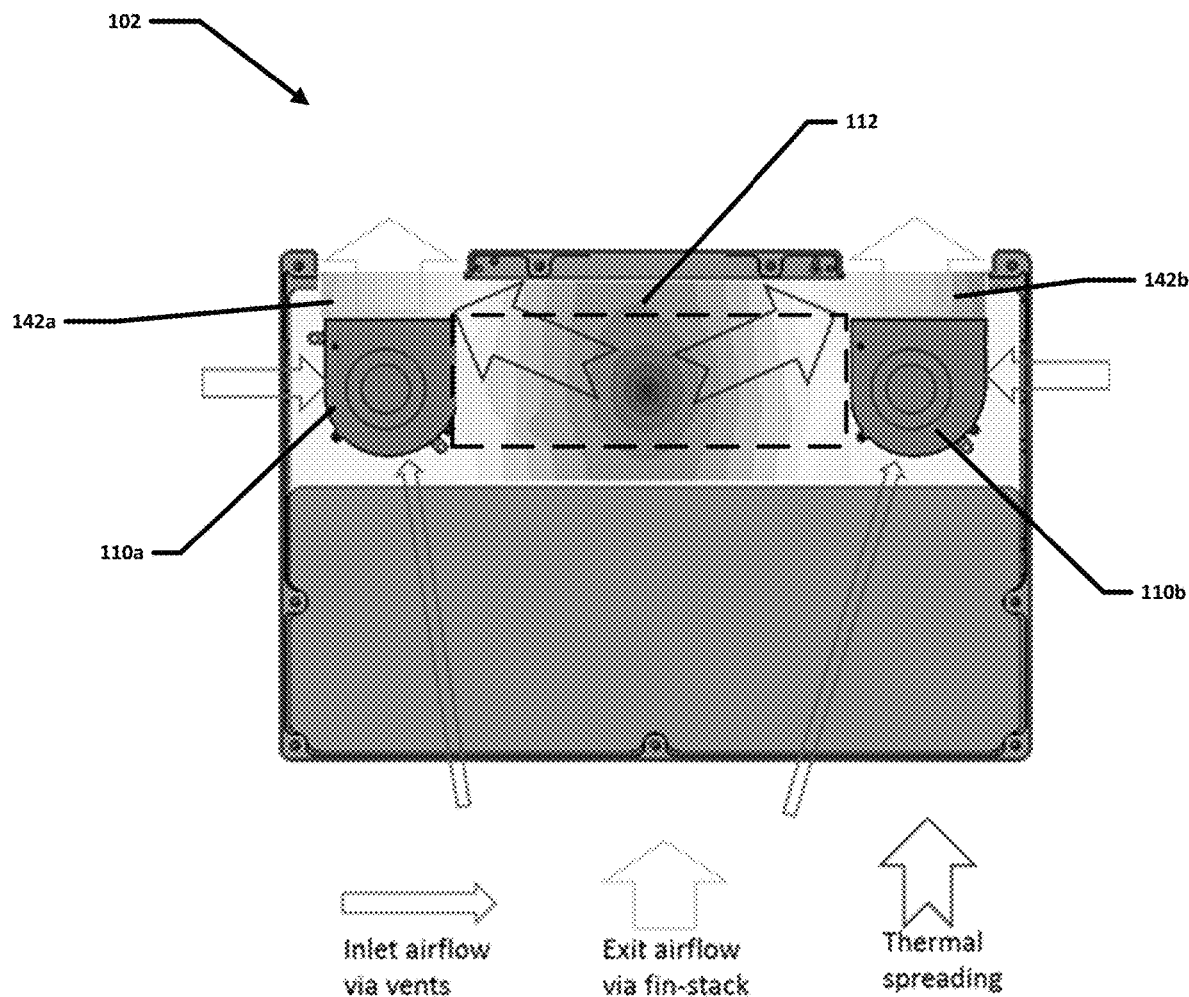
FIG. 5 is a simplified block diagram of a portion of a system to enable a thermal cooling system, in accordance with an embodiment of the present disclosure.

Turning to FIG. 5, FIG. 5 is a simplified block diagram of a portion of first housing 102 configured to include a thermal cooling system. As illustrated in FIG. 5, heat from a heat source can be moved, transmitted, carried, etc. to fin arrays 142a and 142b using vapor chamber 112. Air mover 110a and 110b can cause air to be moved across or through fin array 142a and 142b and collect the heat. The collected heat, or hot air, can be exhausted to help cool first housing 102.

Figure 6:
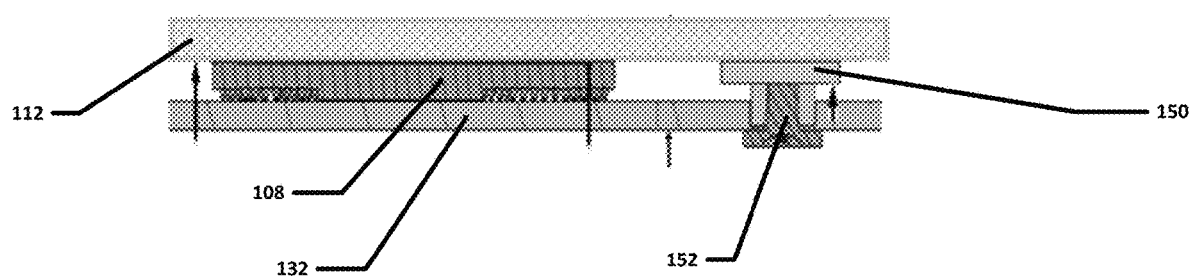
FIG. 6 is a simplified block diagram of a portion of a system to enable a thermal cooling system, in accordance with an embodiment of the present disclosure.

Turning to FIG. 6, FIG. 6 is a simplified block diagram of a portion of first housing 102 configured to include a thermal cooling system. In an example, vapor chamber 112 can be on heat source 108. Heat source 108 can be on PCB 134. Vapor chamber 112 can be bigger than heat source 108 and extent past an edge of heat source 108. A portion of vapor chamber 112 that is not on heat source 108 can include a support 150. Support 150 can be under vapor chamber 112 and secured to PCB 134. For example, vapor chamber 112 can be secured to PCB 134 using securing means 152. Securing means may be a bolt, screw, rivet, or some other securing means that extends through PCB 134 and into support 150 to secure support 150 to PCB 134.

Figure 7:
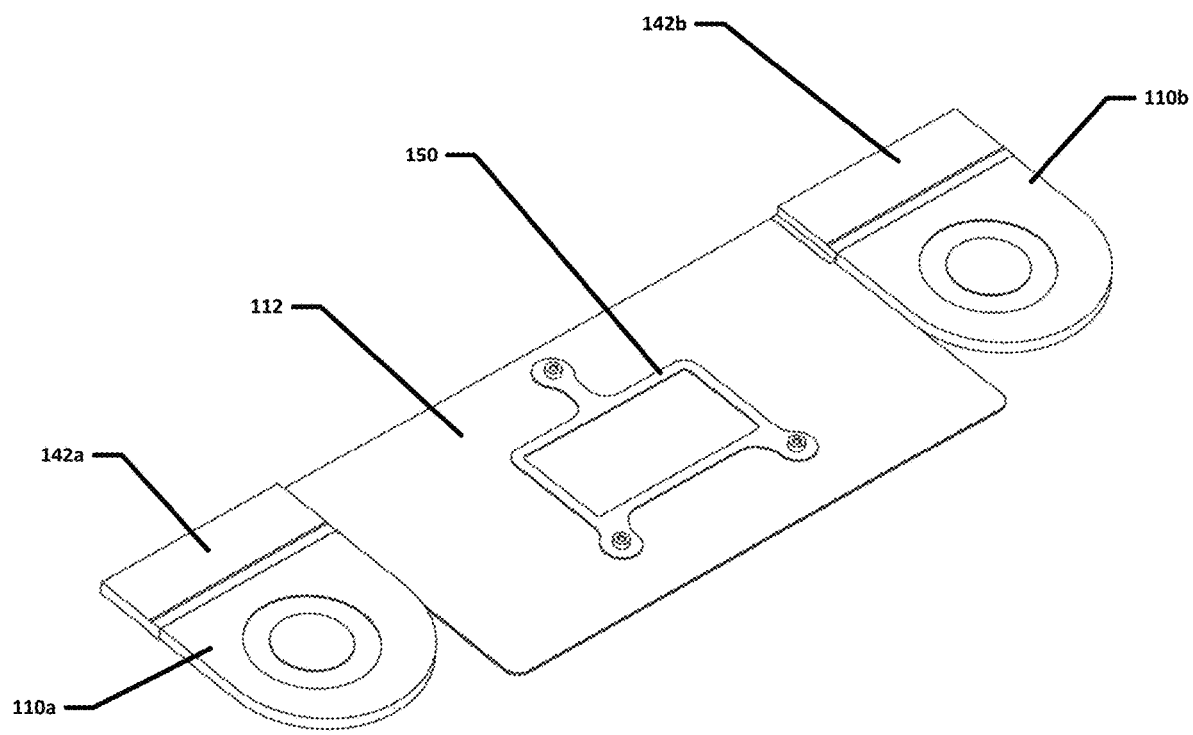
FIG. 7 is a simplified block diagram of a portion of a system to enable a thermal cooling system, in accordance with an embodiment of the present disclosure.

Turning to FIG. 7, FIG. 7 is a simplified block diagram of a portion of first housing 102 configured to include a thermal cooling system. In an example, vapor chamber 112 can be coupled to fin array 142a and to fin array 142b. Heat collected by vapor chamber 112 can be transferred to fin array 142a and to fin array 142b. The exhaust of air mover 110a and air mover 110b can be directed across or through a fin array 142a and 142b to remove the collected heat using exhaust vents 116a and 116b respectively.

Figure 8:
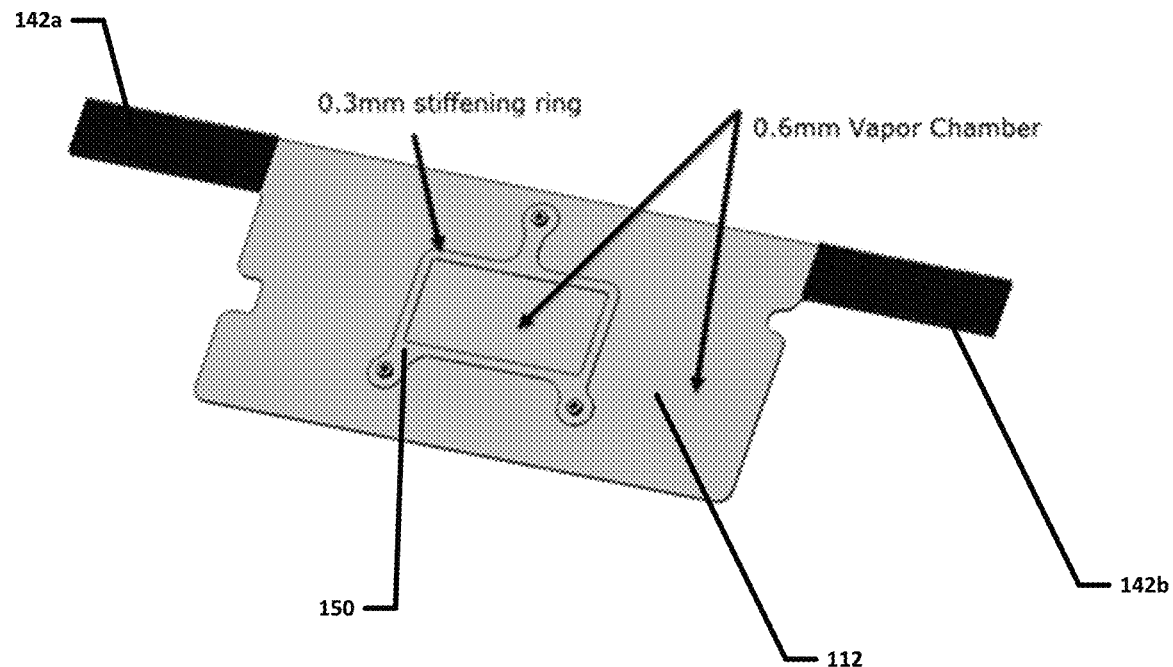
FIG. 8 is a simplified block diagram of a portion of a system to enable a thermal cooling system, in accordance with an embodiment of the present disclosure.

Turning to FIG. 8, FIG. 8 is a simplified block diagram of vapor chamber 112. In an example, vapor chamber 112 can be coupled, in contact with, or otherwise proximate to fin arrays 142a and 142b. Fin arrays 142a and 142b can each include an array of comb or fin like protrusions. The comb or fin like protrusions provide an increased surface contact with the air from air movers 110a and 110b when compared with a flat surface, and thus increases the rate of heat dissipation. In a specific example, vapor chamber 112 can be about 0.6 mm in thickness and support 150 can be about 0.3 mm in thickness. It should be noted that vapor chamber 112 and support 150 can have other thicknesses depending on design choices and the other thicknesses would be apparent to one skilled in the art.

Turning to FIGS. 9A-9G, FIGS. 9A-9G are simplified block diagrams illustrating different examples of a vapor chamber that may be used in a thermal cooling system. The vapor chamber can have almost any profile or shape depending on design choices. In addition, the vapor chamber can include one more supports and the supports can have almost any profile or shape depending on design choices. The design of vapor chamber can help insure the vapor chamber is in contact with most if not all of a heat source or heat sources. The one or more supports can be located in areas where the vapor chamber is not in contact with the heat source or heat sources and the one or more supports can help provide stiffening and/or add strength and support to the vapor chamber.

Figure 9A:
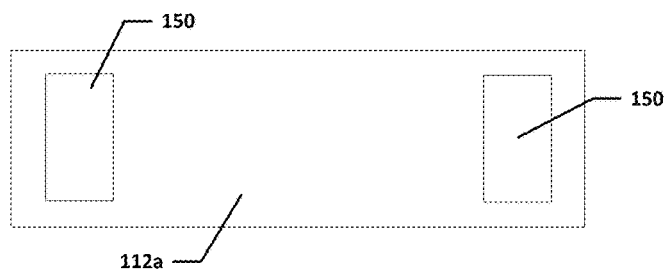
FIGS. 9A-9G are simplified block diagrams of a portion of a system to enable a thermal cooling system, in accordance with an embodiment of the present disclosure.
Figure 9B:
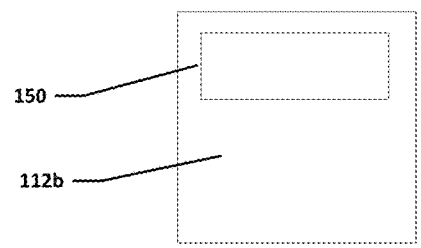
Figure 9C:
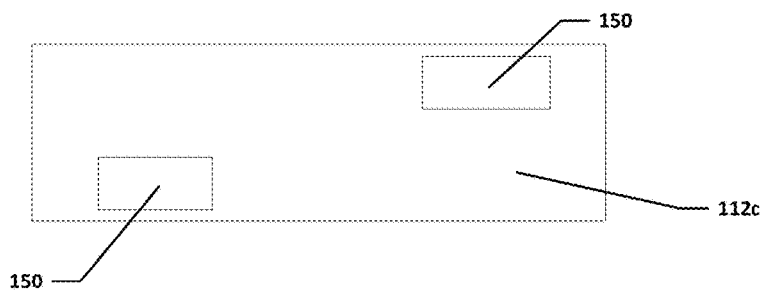
Figure 9D:
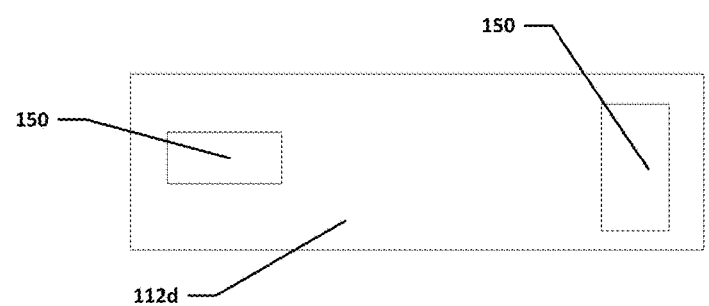
Figure 9E:
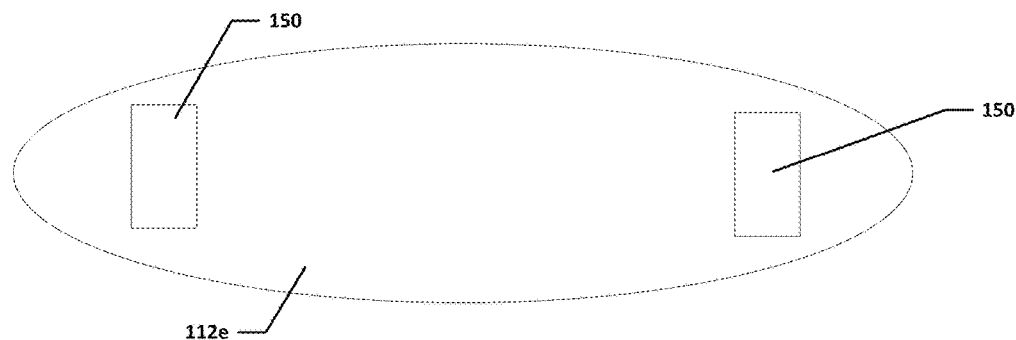
Figure 9F:
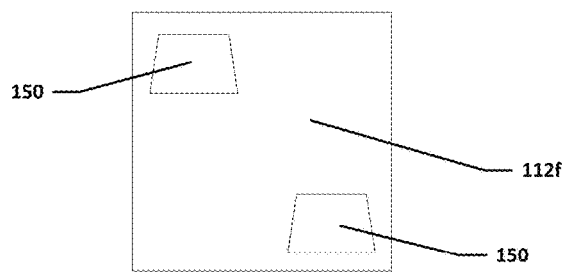
Figure 9G:
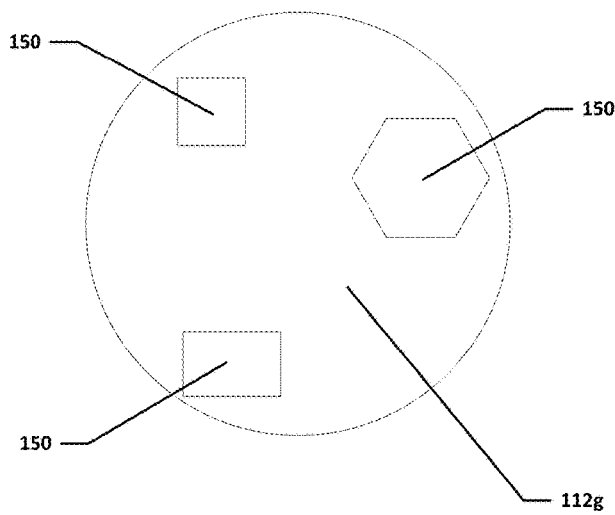

For example, as illustrated in FIG. 9A, vapor chamber 112a can have a rectangular profile and include two supports 150. Each support 150 may have a rectangular profile. As illustrated in FIG. 9B, vapor chamber 112b can have a square profile and include one support 150 with a rectangular profile. As illustrated in FIG. 9C, vapor chamber 112c can have a rectangular profile and include two supports 150. Each support 150 may have a rectangular profile. As illustrated in FIG. 9D, vapor chamber 112d can have a rectangular profile and include two supports 150. Each support 150 may have a rectangular profile. As illustrated in FIG. 9E, vapor chamber 112e can have an oval profile and include two supports 150. Each support 150 may have a rectangular profile. As illustrated in FIG. 9f, vapor chamber 112f can have a square profile and include two supports 150. Each support 150 may have a trapezoidal profile. As illustrated in FIG. 9G, vapor chamber 112g can have a circular profile and include three supports 150. Each support 150 may have a different profile. It should be noted that vapor chamber 112 can have other profiles and include one or more supports 150 with each of the one or more supports have the same profile or one or more different profiles depending on design choices.

Figure 10:
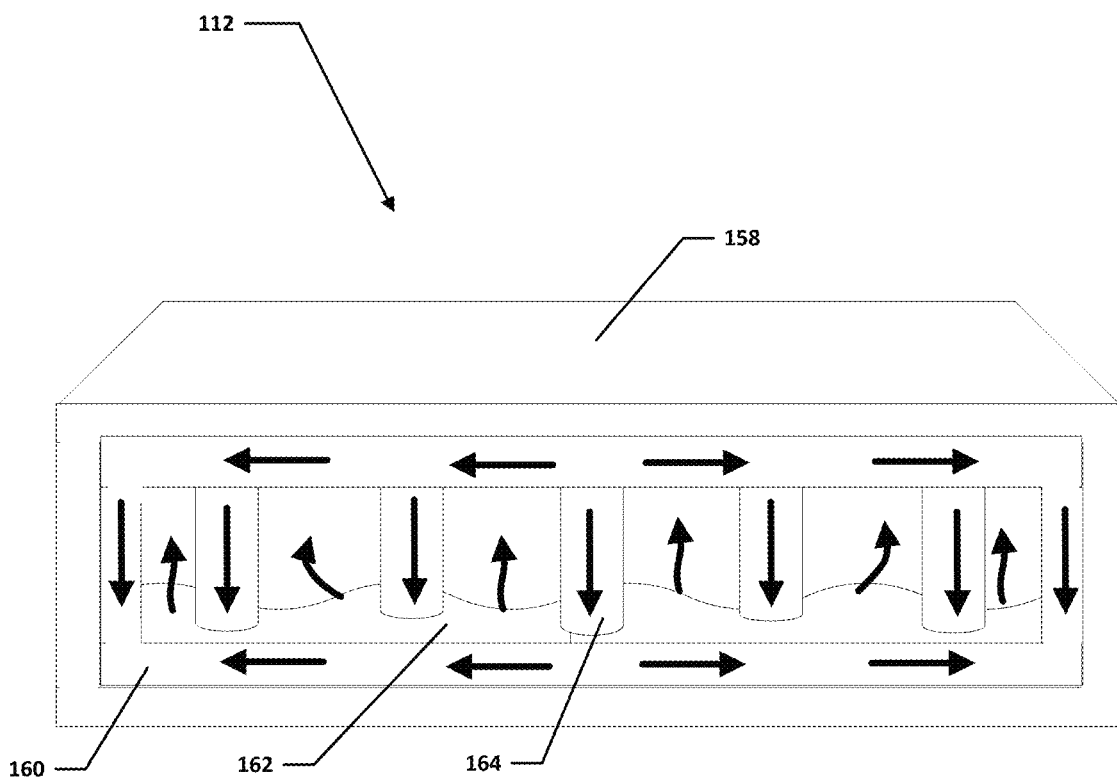
FIG. 10 is a simplified block diagram of a portion of a system to enable a thermal cooling system, in accordance with an embodiment of the present disclosure.

Turning to FIG. 10, FIG. 10 is a simplified block diagram of vapor chamber 112. Vapor chamber 112 can combine the principles of thermal conductivity and phase transition to transfer heat between two solid interfaces such as a heat source and an air mover or a thin fin array. Vapor chamber 112 can include an outer wall 158 that contains a heat pipe 160 and a liquid 162 in a hermetically sealed environment. Liquid 162 can be water. Support posts 164 can help provide structural support to vapor chamber 112.

In an example, at a hot interface of heat pipe 160 (e.g., the area where heat pipe 160 is proximate to the heat source) liquid 162 turns into a vapor by absorbing heat from heat pipe 160. The vapor then travels along heat pipe 160 to a cold interface (e.g., fin array 142) and condenses back into liquid 162 and releases heat to the cold interface. Liquid 162 then returns to the hot interface through capillary action, centrifugal force, gravity, etc. and the cycle repeats.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. For example, electronic device 100 may include two or more air movers 110 with each air mover being independently controlled by thermal management engine or controlled as a unit or group. Additionally, although electronic device 102 has been illustrated with reference to particular elements and operations that facilitate the thermal cooling process, these elements and operations may be replaced by any suitable architecture, protocols, and/or processes that achieve the intended functionality disclosed herein.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

In Example A1, a device can include at least one heat source and a vapor chamber. The vapor chamber is bigger than the at least one heat source and a portion of the vapor chamber is in direct contact with the at least one heat source, where the portion of the vapor chamber in direct contact with the at least one heat source does not include a stiffener.

In Example A2, the subject matter of Example A1 can optionally include at least one fin array coupled to the vapor chamber.

In Example A3, the subject matter of any one of Examples A1-A2 can optionally include where the at least one fin array is soldered to the vapor chamber.

In Example A4, the subject matter of any one of Examples A1-A3 can optionally include at least one air mover.

In Example A5, the subject matter of any one of Examples A1-A4 can optionally include where the air mover directs air through the fin array.

In Example A6, the subject matter of any one of Examples A1-A5 can optionally include a first air mover on a first side of the at least one heat source and a second air mover on an opposite side of the at least one heat source.

In Example A7, the subject matter of any one of Examples A1-A6 can optionally include a first air mover on a first side of the at least one heat source, a first fin array soldered to a first side of the vapor chamber, where exhaust from the first air mover can pass through the first fin array, a second air mover on an opposite side of the at least one heat source, and a second fin array soldered to a second side of the vapor chamber, where exhaust from the second air mover can pass through the second fin array.

In Example A8, the subject matter of any one of Examples A1-A7 can optionally include a first vented foot, where heated air from the first fin array passed through the first vented foot and a second vented foot, where heated air from the second fin array passed through the second vented foot Example M1 is a method including receiving heated air from at least one heat source at a vapor chamber, wherein the vapor chamber is bigger than the at least one heat source and a portion of the vapor chamber is in direct contact with the at least one heat source, wherein the portion of the vapor chamber in direct contact with the at least one heat source does not include a stiffener.

In Example M2, the subject matter of Example M1 can optionally include where the vapor chamber is coupled to a fin array.

In Example M3, the subject matter of any one of the Examples M1-M2 can optionally include causing an air mover to exhaust air through the fin array.

In Example M4, the subject matter of any one of the Examples M1-M3 can optionally include where a first fin array is located on a first side of the vapor chamber and a second fin array is located on a second opposite side of the vapor chamber, the example further including causing a first air mover on the first side of the vapor chamber to exhaust air through the first fin array and causing a second air mover on the second opposite side of the vapor chamber to exhaust air through the second fin array.

In Example M5, the subject matter of any one of the Examples M1-M4 can optionally include causing a first air mover on a first side of the at least one heat source to exhaust air through a first fin array soldered to a first side of the vapor chamber and a first vented foot and causing a second air mover on a second opposite side of the at least one heat source to exhaust air through a second fin array soldered to a second side of the vapor chamber and a second vented foot.

Example S1 is a system for thermal cooling. The system can include memory, a at least one processor, and a vapor chamber. The vapor chamber can be bigger than the at least one heat source and a portion of the vapor chamber is in direct contact with the at least one heat source, wherein the portion of the vapor chamber in direct contact with the at least one heat source does not include a stiffener.

In Example S2, the subject matter of Example S1 can optionally include at least one fin array coupled to the vapor chamber.

In Example S3, the subject matter of any one of the Examples S1-S2 can optionally include where the at least one fin array is soldered to at least one end of the vapor chamber.

In Example S4, the subject matter of any one of the Examples S1-S3 can optionally include at least one air mover, wherein the air mover directs air through the fin array.

In Example S5, the subject matter of any one of the Examples S1-S4 can optionally include a first air mover on a first side of the at least one heat source and a second air mover on an opposite side of the at least one heat source.

In Example S6, the subject matter of any one of the Examples S1-S5 can optionally include a first air mover on a first side of the at least one heat source, a first fin array soldered to a first side of the vapor chamber, where exhaust from the first air mover can pass through the first fin array, a second air mover on an opposite side of the at least one heat source, and a second fin array soldered to a second side of the vapor chamber, where exhaust from the second air mover can pass through the second fin array.

In Example S7, the subject matter of any one of the Examples S1-S6 can optionally include a first vented foot, where heated air from the first fin array passed through the first vented foot and a second vented foot, where heated air from the second fin array passed through the second vented foot.

Example X1 is a machine-readable storage medium including machine-readable instructions to implement a method or realize an apparatus as in any one of the Examples A1-A8, or M1-M5. Example Y1 is an apparatus comprising means for performing any of the Example methods M1-M5. In Example Y2, the subject matter of Example Y1 can optionally include the means for performing the method comprising a processor and a memory. In Example Y3, the subject matter of Example Y2 can optionally include the memory comprising machine-readable instructions.

What is claimed is:

1. A device comprising:
a baseplate for a keyboard;
at least one heat source below the baseplate; and
a vapor chamber, wherein the vapor chamber is between the at least one heat source and baseplate and is bigger than the at least one heat source and a portion of the vapor chamber is in direct contact with the at least one heat source, wherein the portion of the vapor chamber in direct contact with the at least one heat source does not include a stiffener.

2. The device of claim 1, further comprising:
at least one fin array coupled to the vapor chamber.

3. The device of claim 2, wherein the at least one fin array is soldered to the vapor chamber.

4. The device of claim 2, further comprising:
at least one air mover.

5. The device of claim 4, wherein the at least one air mover directs air through the at least one fin array and out of the device using an exhaust vent located in a vented foot, wherein the vented foot supports and elevates a portion of the device when the device is on a surface and allows air to pass under the device.

6. The device of claim 1, further comprising:
a first air mover on a first side of the at least one heat source; and
a second air mover on an opposite side of the at least one heat source.

7. The device of claim 1, further comprising:
a first air mover on a first side of the at least one heat source;
a first fin array soldered to a first side of the vapor chamber, wherein exhaust from the first air mover can pass through the first fin array and out of the device using a first exhaust vent located in a first vented foot;
a second air mover on an opposite side of the at least one heat source; and
a second fin array soldered to a second side of the vapor chamber, wherein exhaust from the second air mover can pass through the second fin array and out of the device using a second exhaust vent located in a second vented foot, wherein the first vented foot and the second vented foot support and elevate a portion of the device when the device is on a surface and allow air to pass under the device.

8. A system for thermal cooling, the system comprising:
a plurality of electronics;
a baseplate for a keyboard;
at least one heat source below the baseplate; and
a vapor chamber, wherein the vapor chamber is between the at least one heat source and baseplate and is bigger than the at least one heat source and a portion of the vapor chamber is in direct contact with the at least one heat source, wherein the portion of the vapor chamber in direct contact with the at least one heat source does not include a stiffener.

9. The system of claim 8, further comprising:
at least one fin array coupled to the vapor chamber.

10. The system of claim 9, wherein the at least one fin array is soldered to at least one end of the vapor chamber.

11. The system of claim 9, further comprising:
at least one air mover, wherein the air mover directs air through the fin array and away from the system using an exhaust vent located in a vented foot, wherein the vented foot supports and elevates a portion of a device that includes the system when the device is on a surface and allows air to pass under the device.

12. The system of claim 8, further comprising:
a first air mover on a first side of the at least one heat source; and
a second air mover on an opposite side of the at least one heat source.

13. The system of claim 8, further comprising:
a first air mover on a first side of the at least one heat source;
a first fin array soldered to a first side of the vapor chamber, wherein exhaust from the first air mover can pass through the first fin array and away from the system using a first exhaust vent located in a first vented foot;
a second air mover on an opposite side of the at least one heat source; and
a second fin array soldered to a second side of the vapor chamber, wherein exhaust from the second air mover can pass through the second fin array and away from the system using a second exhaust vent located in a second vented foot, wherein the first vented foot and the second vented foot support and elevate a portion of a device that includes the system and the first vented foot and the second vented foot allow air to pass under the device when the device is on a surface.

* * * * *